(12) United States Patent
He et al.

(10) Patent No.: US 12,167,573 B2
(45) Date of Patent: Dec. 10, 2024

(54) METHOD AND APPARATUS FOR AN UNEVEN THICKNESS HEAT SPREADER

(71) Applicant: Dell Products, LP, Round Rock, TX (US)

(72) Inventors: Qinghong He, Austin, TX (US); Travis C. North, Cedar Park, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 229 days.

(21) Appl. No.: 17/975,257

(22) Filed: Oct. 27, 2022

(65) Prior Publication Data

US 2024/0147669 A1     May 2, 2024

(51) Int. Cl.
*H05K 7/20*     (2006.01)
*G06F 1/20*     (2006.01)

(52) U.S. Cl.
CPC ........... *H05K 7/2039* (2013.01); *G06F 1/206* (2013.01)

(58) Field of Classification Search
CPC combination set(s) only.
See application file for complete search history.

(56) References Cited

U.S. PATENT DOCUMENTS

| | | | |
|---|---|---|---|
| 6,982,874 B2 * | 1/2006 | Smalc | G06F 1/182 165/185 |
| 7,545,640 B2 | 6/2009 | Fisher | |
| 8,467,168 B2 * | 6/2013 | Honer | H05K 7/20172 361/231 |
| 8,508,908 B2 | 8/2013 | Jewell-Larsen | |
| 9,781,819 B2 * | 10/2017 | Strader | H05K 1/0203 |
| 10,088,878 B2 * | 10/2018 | Aurongzeb | G06F 1/20 |
| 11,439,001 B2 * | 9/2022 | Huang | G06F 1/203 |
| 2005/0063130 A1 | 3/2005 | Francis | |
| 2005/0214180 A1 | 9/2005 | Joannou | |
| 2010/0037886 A1 | 2/2010 | Krichtafovitch | |
| 2010/0051709 A1 | 3/2010 | Krichtafovitch | |
| 2011/0036552 A1 | 2/2011 | Lu | |
| 2011/0261499 A1 | 10/2011 | Hizer | |

(Continued)

FOREIGN PATENT DOCUMENTS

WO     2007/112763 A1     10/2007
WO     2009/131980 A2     10/2009

(Continued)

*Primary Examiner* — Lisa Lea-Edmonds
(74) *Attorney, Agent, or Firm* — Prol Intellectual Property Law, PLLC; H. Kenneth Prol

(57) ABSTRACT

An information handling system includes a hardware processor, a memory device, a video display device, and a power management unit (PMU). The information handling system further includes an uneven thickness heat spreader cooling system including an uneven thickness heat spreader having a first thickness along a first portion of the uneven thickness heat spreader and a second thickness along a second portion of the uneven thickness heat spreader wherein the second thickness along a second portion of the uneven thickness heat spreader is formed at an information handling system chassis location where a width of the uneven thickness heat spreader is narrower than at the first portion of the uneven thickness heat spreader to transfer heat from a warmer portion of the information handling system chassis to a cooling portion of the information handling system chassis.

20 Claims, 6 Drawing Sheets

(56) References Cited

U.S. PATENT DOCUMENTS

| | | |
|---|---|---|
| 2011/0292593 A1 | 12/2011 | June |
| 2012/0007742 A1* | 1/2012 | Gooch .................... H01T 23/00 |
| | | 361/231 |
| 2012/0008248 A1 | 1/2012 | Sawyer |
| 2012/0048529 A1 | 3/2012 | June |
| 2012/0057356 A1 | 3/2012 | Hizer |
| 2012/0205079 A1* | 8/2012 | Jewell-Larsen .... H05K 7/20172 |
| | | 165/104.34 |
| 2012/0268857 A1 | 10/2012 | Jewell-Larsen |
| 2013/0021715 A1 | 1/2013 | Jewel-Larsen |
| 2016/0265856 A1 | 9/2016 | Saveliev |
| 2017/0354225 A1 | 12/2017 | Brickner |
| 2024/0147669 A1* | 5/2024 | He ........................ G06F 1/1616 |

FOREIGN PATENT DOCUMENTS

| | | |
|---|---|---|
| WO | 2011/149667 A1 | 12/2011 |
| WO | 2012/006361 A2 | 1/2012 |

* cited by examiner

METHOD AND APPARATUS FOR AN UNEVEN THICKNESS HEAT SPREADER

FIELD OF THE DISCLOSURE

The present disclosure generally relates to cooling systems for information handling system. The present disclosure more specifically relates to a heat spreader having an uneven thickness for an information handling system.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Under various operating conditions, especially high-performance conditions, information handling systems may generate heat which, if not mitigated, may affect performance. The information handling system may thus include a cooling system used to cool heat-generating hardware therein such as a processing device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
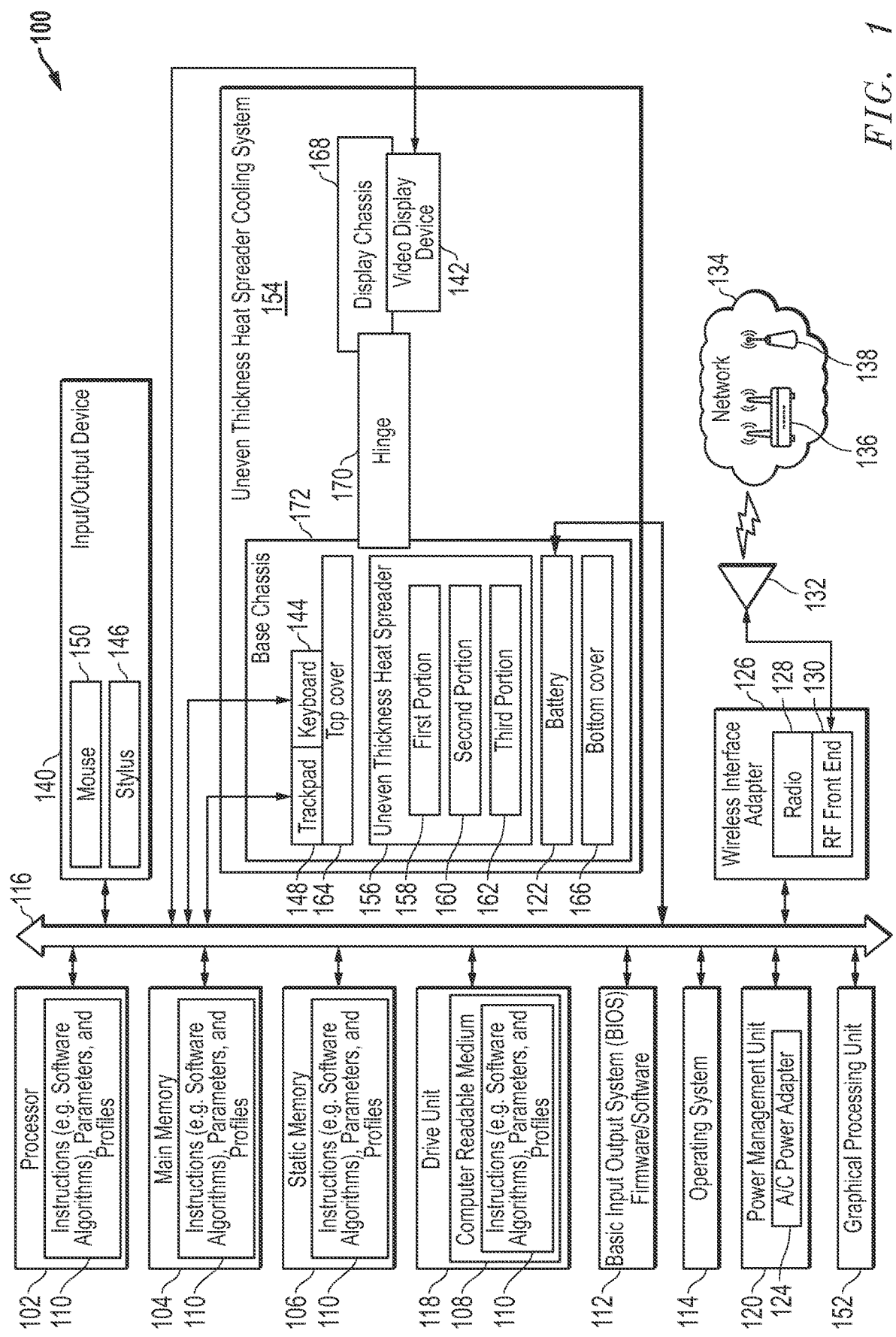
FIG. 1 is a block diagram of an information handling system with an uneven heat spreader cooling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Information handling systems operate to provide computing, data storage, and application resources among other computing resources. The hardware used to provide these resources to the user consume electricity. As a result of the consumption of this electricity, heat is produced within the housing or other structures used to house the hardware. Some information handling systems include a fan or blower used to blow heat from within the housing to a vent to vent the heated air from within the housing. Although these fans or blowers effectively dissipate heat from within the housing, they may create locations along an exhaust vent where heat is accumulated, or heat-generating components may be in a larger number at some areas whereas other may be available to dissipate that heat. This heat may cause damage to certain other devices associated with the information handling system. In one example, the information handling system includes a rear exhaust vent to expel heated air out of the chassis of the information handling system via an active cooling system. The information handling system may further include passive cooling systems that dissipate heat over a surface area and may, in an example embodiment, dissipate heat through convection of heat into the air. These passive cooling systems may be operatively coupled to other passive cooling systems and active cooling systems such as a fan in order to dissipate heat. Locations of these passive cooling systems become more limited as the size and shape of the interior space within the housing of the information decreases as popularity in smaller and lighter information handling systems increases and may be formed to transfer heat between or among areas of an information handling system chassis.

The present specification describes an information handling system that includes a processor, a memory device, and a power management unit (PMU). These hardware devices, along with other hardware devices, may create heat within a housing or chassis of the information handling system that may damage these hardware devices if heat is not dissipated therefrom. Along with, in some embodiments, passive cooling systems, the information includes passive cooling systems such as a heat spreader. The heat spreader, in embodiments herein, is an uneven thickness heat spreader cooling system. The uneven thickness heat spreader cooling system includes an uneven thickness heat spreader having a first thickness along a first portion of the uneven thickness heat spreader and a second thickness along a second portion of the uneven thickness heat spreader. In an embodiment, the second thickness along a second portion of the uneven thickness heat spreader is formed at a housing location where a width of the uneven thickness heat spreader is smaller than at the first portion of the uneven thickness heat spreader. The uneven thicknesses of the uneven thickness heat spreader allows for the uneven thickness heat spreader to have different widths to conform to different physical structures within the housing of the information handling system such as mounting bosses as well as other hardware devices within the housing such as an antenna system and other devices that may be located near the uneven thickness heat spreader. The uneven thickness heat spreader may then have a third portion that has a thickness similar to the first portion in some embodiments.

In some embodiments, the chassis of a laptop type information handling system may include a display housing that includes an "a-cover" or display cover which serves as a back cover for the display housing and a "b-cover" which may include a bezel, if any, and a video display device (e.g., display screen) of the information handling system such as a laptop-type information handling system. In an example embodiment, this laptop information handling system may have a chassis that forms a base chassis and includes a "c-cover" or top cover housing, for example, a keyboard, touchpad/trackpad, and any cover in which these components are set. The base chassis may also include a "d-cover" or bottom cover housing, for example, a processing device, a memory, a power management unit (PMU), wireless interface adapters and other components of the information handling system for the laptop-type information handling system. In an embodiment, the uneven thickness heat spreader described herein may be placed within the base chassis of the information handling system and may be operatively coupled to an interior surface of the bottom cover or top cover. In an embodiment, the uneven thickness heat spreader is operatively coupled to an interior surface of the top cover or bottom cover of the base chassis near a heat exhaust vent formed into the housing of the information handling system. In another embodiment, the uneven thickness heat spreader may additionally, or alternatively be thermally coupled to a battery to use the battery as a heat dump or part of an uneven thickness heat spreader cooling system. The uneven thickness heat spreader may distribute and dissipate heat among these portions of the information handling system base chassis.

FIG. 1 illustrates an information handling system 100 similar to information handling systems according to several aspects of the present disclosure that is operatively couplable to an uneven thickness heat spreader cooling system 154 formed within a housing of the information handling system. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of machine-readable code instructions (sequential or otherwise) that specify actions to be taken by that machine, and can vary in size, shape, performance, price, and functionality. In embodiments described herein, the information handling system 100 is described as a laptop-type information handling system that includes a base chassis operatively coupled to a display chassis via a hinge. The present specification, however, contemplates these other types of information handling systems 100 and the presented example of a laptop-type information handling systems 100 are presented for ease of understanding.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of machine-readable code instructions (sequential or otherwise) via hardware processing resources that specify actions to be taken by that machine. In an embodiment, the information handling system 100 may be operatively coupled to a server or other network device as well as with any wireless peripheral devices. Further, while a single information handling system 100 is illustrated, the term "system" shall also be taken to include any collection of systems or sub-systems that individually or jointly execute a set, or multiple sets, of machine-readable code instructions via hardware processing resources to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, embedded controller (EC), hardware processor, hardware controller, or any combination thereof. Additional components of the information handling system 100 can include one or more storage devices, one or more communications ports for communicating with external devices, as well as various input and output (I/O) devices 140, such as a keyboard 144, a mouse 150, a video display device 142, a stylus 146, a trackpad 148, or any combination thereof. In an embodiment, each I/O device 140 may be operatively coupled to the hardware processor 102 executing a driver to interface with each of the I/O devices 140. The information handling system 100 can also include one or more buses 116 operable to transmit data communications between the various hardware components described herein. Portions of an information handling system 100 may themselves be considered information handling systems and some or all of which may be wireless.

Information handling system 100 can include hardware devices or hardware modules that embody one or more of the devices or execute machine-readable code instructions for the one or more systems and modules via hardware processing resources described above, and operates to perform one or more of the methods described herein. For example, machine-readable code instructions may be executed by a PMU controller, EC, or other hardware processing resource for an active cooling system (e.g., emitter/collector ion pump, a fan, a blower, etc.) operating with an uneven thickness heat spreader cooling system 154 of embodiments herein. The information handling system 100 may execute machine-readable code instructions 110 via hardware processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

The information handling system 100 may include hardware processing resources such as a hardware processor 102, a central processing unit (CPU), accelerated processing unit (APU), a neural processing unit (NPU), a vision processing unit (VPU), an EC, a digital signal processor (DSP), a GPU 152, a microcontroller, or any other type of hardware processing device that executes machine-readable code instructions to perform the processes described herein. Any of the hardware processing resources may operate to execute code that is either firmware or software code. Moreover, the information handling system 100 can include memory such as main memory 104, static memory 106, computer readable medium 108 storing machine-readable code instructions 110 of, in an example embodiment, an active cooling system control system, or other computer executable program code, and drive unit 118 (volatile (e.g., random-access memory, etc.), nonvolatile (read-only memory, flash memory etc.) or any combination thereof).

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user. In an embodiment, the video display device 142 may provide output to a user that includes, for example, one or more windows describing one or more instances of applications being executed by the hardware processor 102 of the information handling system. In this example embodiment, a window may be presented to the user that provides a graphical user interface (GUI) representing the execution of that application.

The network interface device of the information handling system 100 shown as wireless interface adapter 126 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 126 may include one or more radio frequency (RF) subsystems (e.g., radio 128) with transmitter/receiver circuitry, modem circuitry, one or more antenna front end circuits 130, one or more wireless controller circuits, amplifiers, antennas 132 and other circuitry of the radio 128 such as one or more antenna ports used for wireless communications via multiple radio access technologies (RATs). The radio 128 may communicate with one or more wireless technology protocols. In and embodiment, the radio 128 may contain individual subscriber identity module (SIM) profiles for each technology service provider and their available protocols for any operating subscriber-based radio access technologies such as cellular LTE communications.

In an example embodiment, the wireless interface adapter 126, radio 128, and antenna 132 may provide connectivity to one or more of the peripheral devices that may include a wireless video display device 142, a wireless keyboard 144, a wireless mouse 150, a wireless headset, a microphone, a wireless stylus 146, and a wireless trackpad 148, among other wireless peripheral devices used as input/output (I/O) devices 140.

The wireless interface adapter 126 may include any number of antennas 132 which may include any number of tunable antennas for use with the system and methods disclosed herein. Although FIG. 1 shows a single antenna 132, the present specification contemplates that the number of antennas 132 may include more or less of the number of individual antennas shown in FIG. 1. Additional antenna system modification circuitry (not shown) may also be included with the wireless interface adapter 126 to implement coexistence control measures via an antenna controller in various embodiments of the present disclosure.

In some aspects of the present disclosure, the wireless interface adapter 126 may operate two or more wireless links. In an embodiment, the wireless interface adapter 126 may operate a Bluetooth® wireless link using a Bluetooth® wireless or Bluetooth® Low Energy (BLE). In an embodiment, the Bluetooth® wireless protocol may operate at frequencies between 2.402 to 2.48 GHz.

The wireless interface adapter 126 may operate in accordance with any wireless data communication standards. To communicate with a wireless local area network, standards including IEEE 802.11 WLAN standards (e.g., IEEE 802.11ax-2021 (Wi-Fi 6E, 6 GHz)), IEEE 802.15 WPAN standards, WWAN such as 3GPP or 3GPP2, Bluetooth® standards, or similar wireless standards may be used. Wireless interface adapter 126 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 126 can represent an add-in card, wireless network interface module that is integrated with a main board of the information handling system 100 or integrated with another wireless network interface capability, or any combination thereof. In an embodiment the wireless interface adapter 126 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 128 and include wireless controllers to manage authentication, connectivity, communications, power levels for transmission, buffering, error correction, baseband processing, and other functions of the wireless interface adapter 126.

As described herein, the information handling system 100 may include a laptop-type information handling system. A laptop-type information handling system 100 may have a chassis that forms a base chassis 172 and includes a c-cover or top cover 164 housing, for example, a keyboard 144, touchpad/trackpad 148, and any cover in which these components are set. The base chassis 172 may also include a d-cover or bottom cover 166 that houses, for example, a hardware processing device (e.g., hardware processor 102, GPU 152, PMU 120 controller, EC, or other hardware processor), a memory device (e.g., main memory 104, static memory 106, etc.), a PMU 120, wireless interface adapters 126 and other components of the information handling system 100 for the laptop-type information handling system 100. In an embodiment, the uneven thickness heat spreader 156 may be formed at a portion of the housing of the base chassis 172 at or near a heat exhaust vent. In an embodiment, the uneven thickness heat spreader 156 is formed next to the heat exhaust vent at a rear wall of the base chassis 172. In an embodiment, a back cover of the display chassis 168 and bezel and/or video display device 142 forms an enclosed display chassis 168 that may house other hardware devices of the information handling system 100 such as a web-cam, the video display device 142, and other hardware devices. Additionally, as described herein, the base chassis 172 may be operatively coupled to a display chassis 168 via a hinge 170. In an embodiment, this hinge 170 may be a drop-down hinge that drops the display chassis 168 down as the display chassis 168 is placed in an open position.

As described herein, the information handling system 100 may include and be operatively coupled to an uneven thickness heat spreader cooling system 154. The uneven thickness heat spreader cooling system 154 includes an uneven thickness heat spreader 156. The uneven thickness heat spreader 156 may be a formed of metal such as copper or aluminum in an embodiment. In another embodiment, the uneven thickness heat spreader 156 may be a sheet of graphite as described in embodiments herein. The present specification describes the uneven thickness heat spreader 156 as being made of a sheet of graphite, however, the present specification contemplates that any other type of heat conductive material such as copper and aluminum, may also be used.

The uneven thickness heat spreader 156 acts as a passive cooling device that conducts heat away from a heat-generating hardware device or other passive cooling systems (e.g., heat pipe, vapor chamber, fin-stack, etc.). In an embodiment, the uneven thickness heat spreader 156 may dissipate heat, via convection heating, into the air within the housing of the information handling system. This heated air may be passed out of the housing of the information handling via use of active cooling systems such as a blower, fan, or ionic blower device that creates an airflow into the base chassis 172 via an air intake vent and out of the housing of the information handling system 100 via a heat exhaust vent. In an embodiment, the uneven thickness heat spreader 156 of the uneven thickness heat spreader cooling system 154 may be placed near to the heat exhaust vent formed in a back wall of the base chassis 172 and spread heat along a length of the exhaust vent so that airflow created by active cooling systems may pass air over the uneven thickness heat spreader 156 and dissipate heat via convection out of the base chassis 172. In another embodiment, the uneven thickness heat spreader 156 of the uneven thickness heat spreader cooling system 154 may be operatively coupled to a battery 122 so that heat can be conducted into the body of the battery from the heat-generating devices or other passive cooling device.

The uneven thickness heat spreader 156 includes a first portion 158 that has a first thickness of material. The sheet of material such as graphite may have a width and length such that a flat surface of the uneven thickness heat spreader 156 is operatively coupled to either or both of the top cover 164 and bottom cover 166. The thickness of the uneven thickness heat spreader 156 is, therefore, a dimension of the uneven thickness heat spreader 156 that extends above the interior surface of the bottom cover 166 or below the interior surface of the top cover 164. In an embodiment, the thickness of the first portion 158 may be about 0.1 mm thick. It is appreciated, however, that other thicknesses of the first portion 158 of the uneven thickness heat spreader 156 may be used based on an anticipated amount of heat generated by the heat-generating hardware devices within the base chassis 172 of the information handling system 100. In the embodiments described herein, the thermal resistance of the sheet of graphite (or sheet of copper or aluminum) that forms the uneven thickness heat spreader 156 may be equal to the thickness of the sheet of graphite divided by the product of the thermal conductivity of graphite and the length and width (e.g., a chosen area) of the sheet of graphite.

The uneven thickness heat spreader 156 further includes a second portion 160 that has a second thickness that is thicker than the thickness of the first portion 158 of the uneven thickness heat spreader 156. In an embodiment, this second portion 160 is formed along a surface of the uneven thickness heat spreader 156 where a width of the uneven thickness heat spreader 156 is to be reduced due to the placement of the uneven thickness heat spreader 156 at a housing location where the width of the uneven thickness heat spreader 156 must be shorter such as where a mounting boss is formed in the housing of the information handling system 100. A mounting boss may be used to operatively coupled the top cover 164 to the bottom cover 166 or mount other items to the top cover 164 or bottom cover 166 such as a printed circuit board (PCB). The width of the uneven thickness heat spreader 156 may be shortened to make space for other hardware or to conform to features of the interior of the top cover 164 or bottom cover 166.

It is appreciated that as the width of the uneven thickness heat spreader 156 is reduced at these housing locations described herein, the thermal resistance of the uneven thickness heat spreader 156 at these housing locations is reduced. In order to overcome this thermal resistance and increase the thermal conductivity across the uneven thickness heat spreader 156 the thickness of the uneven thickness heat spreader 156 is increased at this second portion 160 of the uneven thickness heat spreader 156 where the width of the uneven thickness heat spreader 156 has been reduced. Where the uneven thickness heat spreader 156 is made of graphite, the thickness of the second portion 160 of the uneven thickness heat spreader 156 may be accomplished by compressing more amounts of raw graphite at the second portion 160 than at the first portion 158 of the uneven thickness heat spreader 156. In an alternative manufacturing process of the uneven thickness heat spreader 156, additional layers of graphite may be disposed at the second portion 160 via vapor deposition or other processes such as vaporization. Where the uneven thickness heat spreader 156 is made of copper or aluminum, the thicker second portion 160 may be created by molding the uneven thickness heat spreader 156 with the second portion 160 including more material.

In an embodiment, as the width of the uneven thickness heat spreader 156 can transition from a short width and thicker second portion 160 to a wider third portion 162, the thickness of the uneven thickness heat spreader 156 may be reduced. This is because the thermal conductivity is maintained as the width of the uneven thickness heat spreader 156 at the third portion 162 is increased while the thickness of the uneven thickness heat spreader 156 at the third portion 162 is decreased. In an embodiment, the thickness of the third portion 162 may be about equal to the thickness of the first portion 158. In an embodiment, the thickness of the third portion 162 may be thinner than the thickness of the second portion 160.

As described herein, the uneven thickness heat spreader 156 may be operatively coupled to a heat-generating device at a first end of the uneven thickness heat spreader 156 so that heat may be conducted into the uneven thickness heat spreader 156 and along the entire length of the uneven thickness heat spreader 156 that includes the first portion 158, second portion 160, and third portion 162 as described herein. In an embodiment, the uneven thickness heat spreader 156 may be operatively coupled to one or more passive cooling devices such as a heat pipe, a vapor chamber, and a fin-stack, among others. These passive cooling devices may conduct heat from heat-generating hardware devices into the first end of the uneven thickness heat spreader 156, along the length of the uneven thickness heat spreader 156 (e.g., through the first portion 158, second portion 160, and third portion 162) and to a second end of the uneven thickness heat spreader 156 for dissipation of heat and convective heating of the air within the housing of the information handling system 100. In an embodiment, the heat dissipated into the air by the convective properties of the uneven thickness heat spreader 156 may be passed out of the housing of the information handling system 100 by an active cooling device producing an airflow over the uneven thickness heat spreader 156 that cools the uneven thickness heat spreader 156 and passes the heat out of the housing.

In an embodiment, a first end of the uneven thickness heat spreader 156 may be operatively coupled to a heat-generating hardware device within the housing of the information handling system 100 while a second end of the uneven thickness heat spreader 156 is operatively coupled to the battery 122 of the information handling system 100. The battery 122 may be formed to be able to conduct an amount of heat from the uneven thickness heat spreader 156 and dissipate or absorb that heat over the relatively larger surface area of the battery 122. In an embodiment, a battery 122 be used with uneven thickness heat spreader 156 that includes a first portion, a second portion, and a third portion of the uneven thickness heat spreader 156 with the first portion and third portion being thinner than the second portion of the uneven thickness heat spreader. In an embodiment, the battery 122 placed on one side of the information handling system may be operatively and thermally coupled to the third portion of the uneven thickness heat spreader 156 with heat-generating hardware devices operatively coupled to the uneven thickness heat spreader at another side of the information handling system such as at the first portion.

In another embodiment, the uneven thickness heat spreader 156 may transition from a first thickness at a first portion 158 of the uneven thickness heat spreader 156 to a second thickness at a second portion 160 of the uneven thickness heat spreader 156 where the first portion 158 is thicker than the second portion 160. In this embodiment, the width of the first portion 158 may be smaller than the width of the second portion 160 such that heat is still conducted from the first portion 158 to the second portion 160 to be dissipated into the battery 122. In an embodiment, the uneven thickness heat spreader 156 may be thermally coupled to the battery 122 as described herein while also being placed next to a heat exhaust vent for heat from the uneven thickness heat spreader 156 to be passed out of the housing of the information handling system 100 via operation of an active cooling system described herein.

The information handling system 100 can include one or more sets of machine-readable code instructions 110 that can be executed by hardware processing resources to cause the computer system to perform any one or more of the methods or computer-based functions disclosed herein. For example, machine-readable code instructions 110 may be executed for various software applications, software agents, a basic input/output system (BIOS) 112 firmware and/or software, or other aspects or components. Machine-readable code instructions 110 may execute an uneven thickness heat spreader cooling system 154 to control various aspects of the uneven thickness heat spreader cooling system 154 of the embodiments herein. In an embodiment, this may include controlling, via the hardware processor 102 or a PMU controller, the operation of the active cooling device (e.g., fan, blower, or ionic blower) such as the speed of rotation of a fan or velocity of airflow created by the fan, blower or ionic blower. Various software modules comprising application machine-readable code instructions 110 may be coordinated by an operating system (OS) 114, and/or via an application programming interface (API). An example OS 114 may include Windows®, Android®, and other OS types known in the art. Example APIs may include Win 32, Core Java API, or Android APIs.

The disk drive unit 118 and may include a computer-readable medium 108 in which one or more sets of machine-readable code instructions 110 such as software can be embedded to be executed by the hardware processor 102 or other hardware processing devices such as a GPU 152 to perform the processes described herein. Similarly, main memory 104 and static memory 106 may also contain a computer-readable medium for storage of one or more sets of machine-readable code instructions, parameters, or profiles 110 described herein. The disk drive unit 118 or static memory 106 also contain space for data storage. Further, the machine-readable code instructions 110 may embody one or more of the methods as described herein. In a particular embodiment, the machine-readable code instructions, parameters, and profiles 110 may reside completely, or at least partially, within the main memory 104, the static memory 106, and/or within the disk drive 118 during execution by the hardware processor 102 or GPU 152 of information handling system 100. The main memory 104, GPU 152, and the hardware processor 102 also may include computer-readable media.

Main memory 104 or other memory of the embodiments described herein may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The applications and associated APIs, for example, may be stored in static memory 106 or on the drive unit 118 that may include access to a computer-readable medium 108 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a hardware processor or that cause a computer system to perform any one or more of the methods or operations disclosed herein.

In an embodiment, the information handling system 100 may further include a power management unit (PMU) 120 (a.k.a. a power supply unit (PSU)). The PMU 120 may include a hardware controller and machine-readable and executable code instructions to manage the power provided to the components of the information handling system 100 such as the hardware processor 102, and manage control of the active cooling system that includes, some embodiments, a fan motor and motor driver hardware, activation of a blower, and activation of an ionic blower. The PMU 120 may control power to one or more components including one or more drive units 118, the hardware processor 102 (e.g., CPU), the GPU 152, a video/graphic display device 142 or other input/output devices 140 such as the stylus 146, a mouse 150, a keyboard 144, and a trackpad 148 and other components that may require power when a power button has been actuated by a user. In an embodiment, the PMU 120 may monitor power levels or temperature via thermistors and be electrically coupled, either wired or wirelessly, to the information handling system 100 to provide this power and coupled to bus 116 to provide or receive data or machine-readable code instructions. The PMU 120 may regulate power from a power source such as a battery 122 or A/C power adapter 124. In an embodiment, the battery 122 may be charged via the A/C power adapter 124 and provide power to the components of the information handling system 100 via a wired connections as applicable, or when A/C power from the A/C power adapter 124 is removed. PMU 120 may include a hardware controller to execute machine-readable code instructions 110 of an active cooling control system used with the uneven thickness heat spreader cooling system 154 to control the active cooling devices based on one or more detected temperature thresholds according to embodiments of the present disclosure.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

When referred to as a "system," a "device," a "module," a "controller," or the like, the embodiments described herein can be configured as hardware or hardware executing code instructions of software or firmware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device). The system, device, controller, or module can include hardware executing software or firmware embedded at a device, such as an Intel® Core class processor, ARM® brand processors, Qualcomm® Snapdragon processors, or other hardware processors and chipsets, or other such device, or software capable of operating a relevant environment of the information handling system. The system, device, controller, or module can also include a combination of the foregoing examples of hardware or hardware executing software. Note that an information handling system can include an integrated circuit or a board-level product having portions thereof that can also be any combination of hardware and software. Hardware devices, hardware modules, hardware resources, hardware controllers, that are in communication with one another need not be in continuous communication with each other, unless expressly specified otherwise. In addition, hardware devices, hardware modules, hardware resources, or hardware controllers that are in communication with one another can communicate directly or indirectly through one or more intermediaries.

Figure 2:
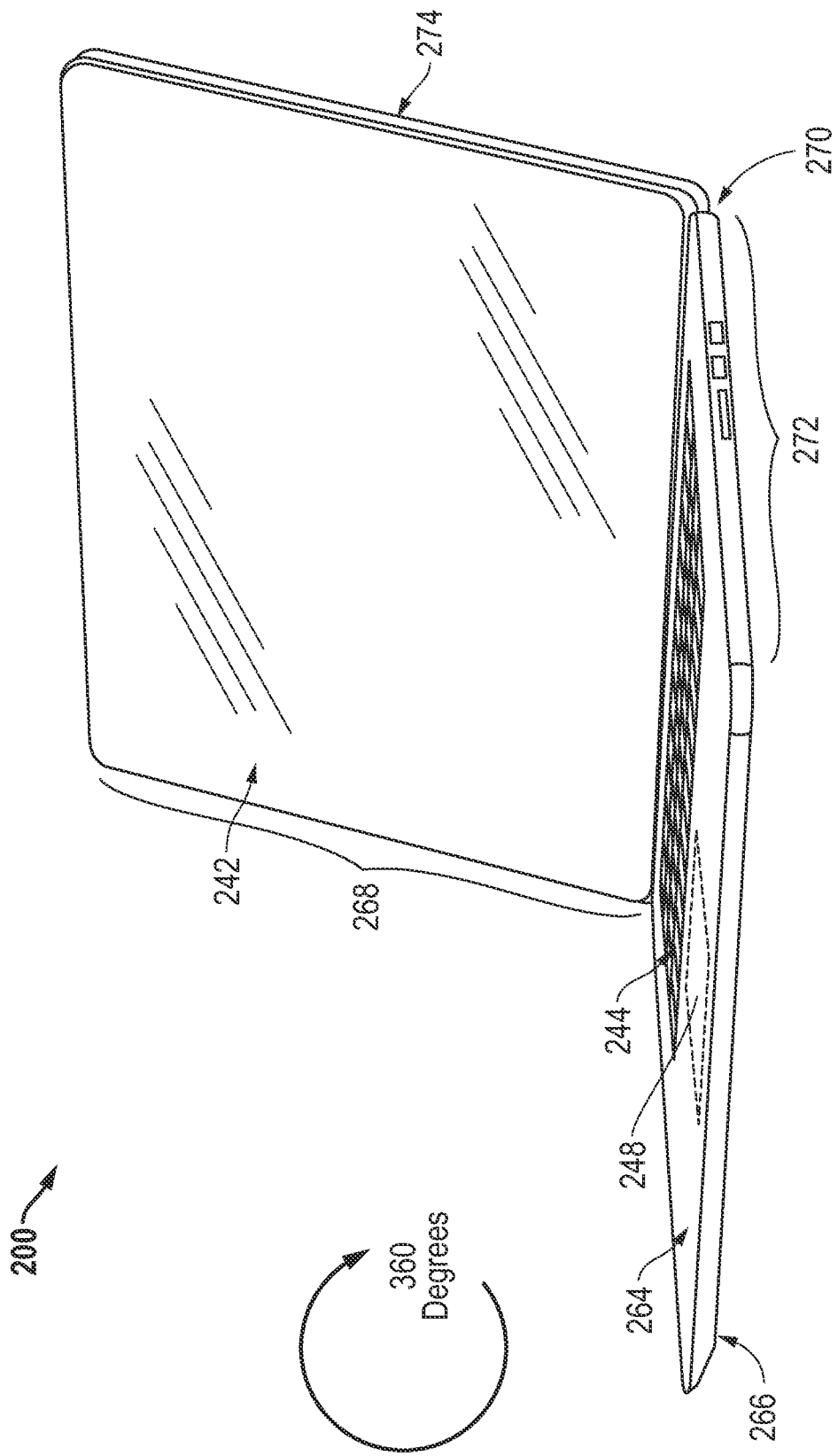
FIG. 2 is a graphic diagram of an information handling system housing an uneven heat spreader cooling system according to an embodiment of the present disclosure.

FIG. 2 is a graphic diagram of an information handling system 200 housing an uneven heat spreader cooling system (not shown) according to an embodiment of the present disclosure. The information handling system 200 may, in an example embodiment, be a laptop-type information handling system 200. In the example shown in FIG. 2, the information handling system 200 may be a 360° information handling system 200 where an exterior surface of the bottom cover 266 of a base chassis 272 may be brought towards an exterior side of a back cover 274 of the display chassis 268 to place the information handling system 200 in a tablet configuration in one embodiment. As shown in FIG. 2, the information handling system 200 may also be placed in a laptop configuration where the base chassis 272 is lying flat on a surface with the display chassis 268 being placed upright from the base chassis 272.

As described herein, the rear exhaust vent (not shown) may be formed on a rear surface where the bottom cover 266 and top cover 264 are coupled together. Additionally, the base chassis 272 may be operatively coupled to a display chassis 268 via a hinge 270. In an embodiment, this hinge 270 may be a drop-down hinge that drops the display chassis 268 down as the display chassis 268 is placed in an open position as shown.

As described herein, the information handling system 200 may include and be operatively coupled to an uneven thickness heat spreader cooling system described herein. It is appreciated that because the uneven thickness heat spreader cooling system is housed within the base chassis 272, FIG. 2 does not show the uneven thickness heat spreader of the uneven thickness heat spreader cooling system. However, it is appreciated that the uneven thickness heat spreader may be placed at any location within the base chassis 272 so that heat from the heat-generating devices may be conducted through the uneven thickness heat spreader 156 and distributed to areas of base chassis 272 with venting or a battery location or other hardware structure that may act as a heat reservoir or heat dump as described herein. The uneven thickness heat spreader may be a sheet of metal such as copper or aluminum in an embodiment. In another embodiment, the uneven thickness heat spreader may be a sheet of graphite as described in embodiments herein.

The uneven thickness heat spreader acts as a passive cooling device that conducts heat away from a heat-generating hardware device or other passive cooling systems (e.g., heat pipe, vapor chamber, fin-stack, etc.) to other areas of base chassis 272. In an embodiment, the uneven thickness heat spreader may dissipate heat, via convection into the air within the housing of the information handling system. This heated air may be passed out of the housing of the information handling via use of active cooling systems such as a blower, fan, or ionic blower device that creates an airflow into the base chassis via an air intake vent and out of the housing of the information handling system 200 and passive cooling systems such as thermal fans and out of a heat exhaust vent. In an embodiment, the uneven thickness heat spreader may be placed near to the heat exhaust vent formed in a back wall of the base chassis 272 to spread heat along the length of the heat exhaust vent or vents so that airflow created by active cooling systems may pass air over the uneven thickness heat spreader and dissipate heat via convection out of the base chassis. In an embodiment, the uneven thickness heat spreader may be operatively coupled to a battery so that heat can be conducted into the body of the battery from the heat-generating devices or other passive cooling device in other portions of the base chassis 272.

The uneven thickness heat spreader includes a first portion that has a first thickness of material. The sheet of material such as graphite may have a width and length such that a flat surface of the uneven thickness heat spreader is operatively coupled to either or both of the top cover 264 and bottom cover 266. The thickness of the uneven thickness heat spreader first portion is, therefore, a dimension of the uneven thickness heat spreader that extends above the interior surface of the bottom cover 266 or below the interior surface of the top cover 264. In an embodiment, the thickness of the first portion may be about 0.1 mm thick. It is appreciated, however, that other thicknesses of the first portion of the uneven thickness heat spreader may be used based on implementation in the base chassis 272 and an anticipated amount of heat generated by the heat-generating hardware devices within the base chassis 272 of the information handling system 200.

The uneven thickness heat spreader further includes a second portion that has a second thickness that is thicker than the thickness of the first portion of the uneven thickness heat spreader. In an embodiment, this second portion is formed along a surface of the uneven thickness heat spreader where a width of the uneven thickness heat spreader is to be reduced due to the placement of the uneven thickness heat spreader at a housing location within the base chassis 272 where the width of the uneven thickness heat spreader must be narrower such as where a mounting boss is formed in the housing of the information handling system 200. A mounting boss may be used to operatively coupled the top cover 264 to the bottom cover 266 or mount other items to the top cover 264 or bottom cover 266 such as a PCB. The width of the uneven thickness heat spreader may be narrowed to make space for other hardware or to conform to features of the interior of the top cover 264 or bottom cover 266.

It is appreciated that as the width of the uneven thickness heat spreader is reduced at these housing locations described herein, the thermal resistance of the uneven thickness heat spreader at these housing locations is increased. In order to overcome this thermal resistance increase, and to increase the thermal conductivity across the uneven thickness heat spreader, the thickness of the uneven thickness heat spreader is increased at this second portion of the uneven thickness heat spreader where the width of the uneven thickness heat spreader has been reduced. Where the uneven thickness heat spreader is made of graphite, the thickness of the second portion of the uneven thickness heat spreader may be accomplished by compressing more amounts of raw graphite at the second portion than at the first portion of the uneven thickness heat spreader. In an alternative manufacturing process of the uneven thickness heat spreader, additional layers of graphite may be disposed at the second portion via vapor deposition or other processes such as vaporization. Where the uneven thickness heat spreader is made of copper or aluminum, the thicker second portion may be created by molding the uneven thickness heat spreader with the second portion including more material for a thicker portion of the uneven thickness heat spreader.

In an embodiment, as the width of the uneven thickness heat spreader can transition from a short width and thicker second portion to a wider third portion, the thickness of the uneven thickness heat spreader may be reduced. This is because the thermal conductivity is maintained as the width of the uneven thickness heat spreader at the third portion is increased while the thickness of the uneven thickness heat spreader at the third portion is decreased. In an embodiment, the thickness of the third portion may be about equal to the thickness of the first portion. In an embodiment, the thickness of the third portion may be thinner than the thickness of the second portion. It is appreciated that the thickness of the uneven thickness heat spreader may change any number of times when the width of the uneven thickness heat spreader is changed as a result of the placement of hardware devices and/or housing locations in a base chassis 272 requiring the width to change.

In an embodiment, the uneven thickness heat spreader may be operatively coupled to one or more passive cooling devices such as a heat pipe, a vapor chamber, and a thermal fin-stack, among others. These passive cooling devices may conduct heat from heat-generating hardware devices into the first end of the uneven thickness heat spreader, along the length of the uneven thickness heat spreader (e.g., through the first portion, second portion, and third portion) and to a second end of the uneven thickness heat spreader for dissipation of heat via convection into the air within the housing of the information handling system 200 or into a heat reservoir or heat dump structure with high heat capacity such as the battery. In an embodiment, the heat dissipated into the air by the convective properties of the uneven thickness heat spreader may be passed out of the housing of the information handling system 200 by an active cooling device producing an airflow over the uneven thickness heat spreader that cools the uneven thickness heat spreader and passes the heat out of the housing.

In an embodiment, a first end of the uneven thickness heat spreader may be operatively coupled to a heat-generating hardware device within the housing of the information handling system 200 while a second end of the uneven thickness heat spreader is operatively coupled to the battery of the information handling system 200 as described above. The battery may be formed to be able to conduct and absorb an amount of heat from the uneven thickness heat spreader and dissipate that heat over the relatively larger surface area of the battery. In a different embodiment of the uneven thickness heat spreader may be used as well. The uneven thickness heat spreader may transition from a first thickness at a first portion of the uneven thickness heat spreader to a second thickness at a second portion of the uneven thickness heat spreader where the first portion is thicker than the second portion. In this embodiment, the width of the first portion may be smaller than the width of the second portion such that heat is still conducted from the first portion to the second portion to be dissipated into the battery thermally coupled to the second portion. The first portion may be thermally coupled to a heat-generating device or to another passive cooling structure in some embodiments. In an embodiment, the uneven thickness heat spreader may be thermally coupled to the battery as described herein while also being placed next to a heat exhaust vent for heat from the uneven thickness heat spreader to be passed out of the housing of the information handling system 200 via operation of an active cooling system described herein.

Figure 3:
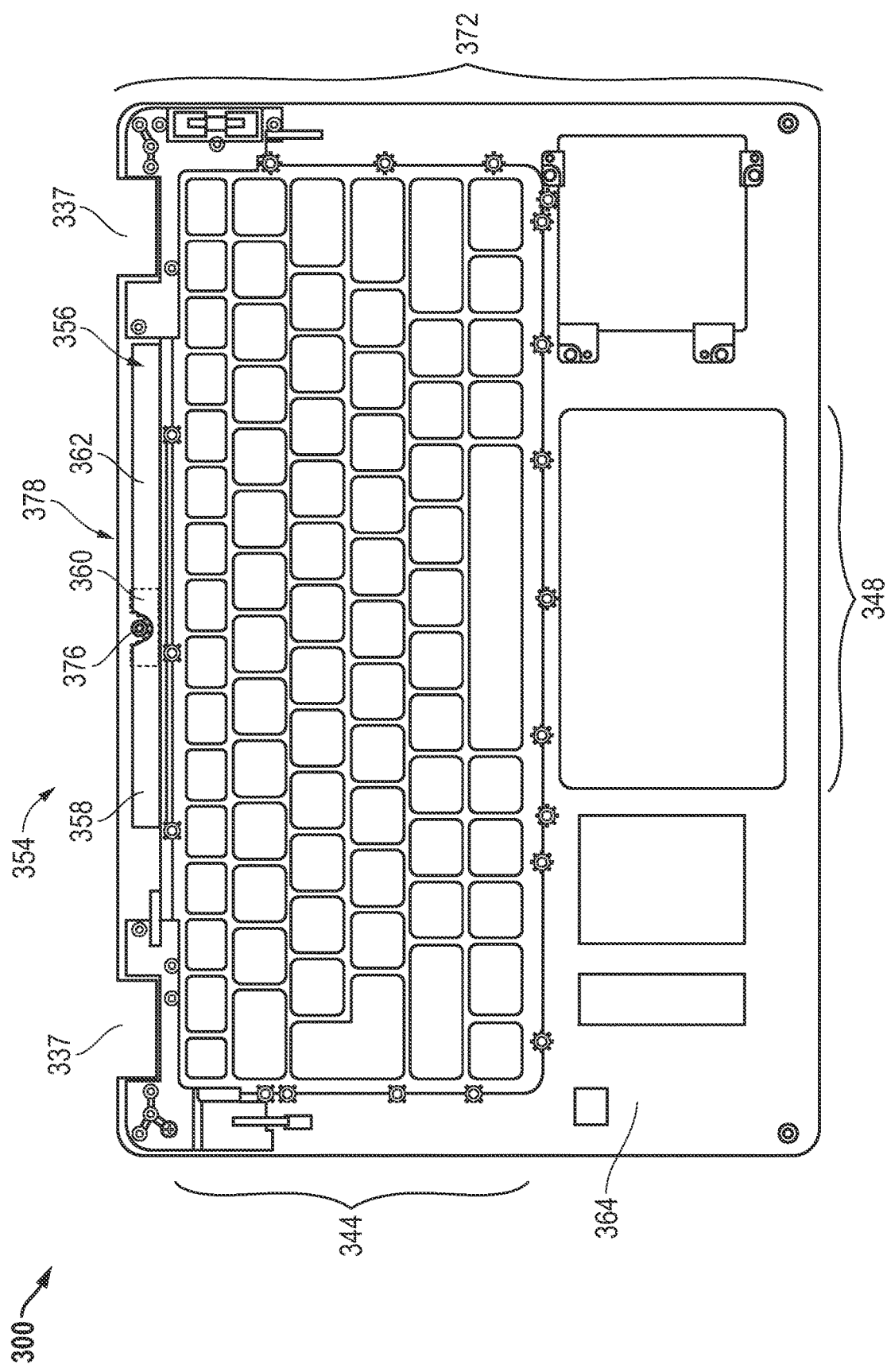
FIG. 3 is a graphic diagram top view of an uneven heat spreader cooling system including an uneven heat spreader formed within a base chassis of an information handling system in an embodiment of the present disclosure.

FIG. 3 is a graphic diagram top view of an uneven thickness heat spreader cooling system 354 including an uneven thickness heat spreader 356 formed within a base chassis 372 of an information handling system 300 in an embodiment of the present disclosure. FIG. 3 shows the base chassis 372 that includes the top cover 364 with a view of the interior side with the bottom cover (not shown) removed to show hardware devices within the top cover 364 including the uneven thickness heat spreader 356 as described herein. FIG. 3 shows the location of the keyboard 344 and trackpad 348 in the top cover 364 where the user may provide input to the information handling system 300.

In an embodiment, a heat exhaust vent 378 may, at least partially, be formed into the top cover 364 where air may be expelled from within the housing of the information handling system 300. In an embodiment, the bottom cover of the base chassis 372 may include other portions of the heat exhaust vent 378 such that when the bottom cover is coupled to the top cover 364 the heat exhaust vent 378 is formed. In another example embodiment, the heat exhaust vent 378 may be formed into a back side wall of the bottom cover.

FIG. 3 further shows an example location of the uneven thickness heat spreader 356 at or near the heat exhaust vent 378. The uneven thickness heat spreader 356 may be a sheet of metal such as copper or aluminum in an embodiment. In another embodiment, the uneven thickness heat spreader 356 may be a sheet of graphite as described in embodiments herein. The present specification describes the uneven thickness heat spreader 356 as being made of a sheet of graphite, however, the present specification contemplates that any other type of heat conductive material such as copper and aluminum, may also be used. FIG. 3 shows where the top cover 364 would be operatively coupled to a display chassis via one or more hinges 337.

The uneven thickness heat spreader 356 acts as a passive cooling device that conducts heat away from a heat-generating hardware device or passive cooling systems (e.g., heat pipe, vapor chamber, fin-stack, etc.). In an embodiment, the uneven thickness heat spreader 356 may transfer or spread heat to be dissipated, via convection heating, into the air within the housing of the information handling system. This heated air may be passed out of the housing of the information handling via use of active cooling systems such as a blower, fan, or ionic blower device that creates an airflow into the base chassis 372 via an air intake vent and out of the housing of the information handling system 300 via a heat exhaust vent. In an embodiment, the uneven thickness heat spreader 356 may be placed near to the heat exhaust vent formed in a back wall of the base chassis 372 to spread heat to or along a length of one or more exhaust vents so that airflow created by active cooling systems may pass air over the uneven thickness heat spreader 356 and dissipate heat via convection out of the base chassis 372. This may be done with a passive cooling device such as the thermal fin stack. In an embodiment, the uneven thickness heat spreader 356 may be operatively coupled to a battery (not shown) so that heat can be conducted into the body of the battery from the heat-generating devices or other passive cooling device.

The uneven thickness heat spreader 356 includes a first portion 358 that has a first thickness of material. The sheet of material such as graphite may have a width and length such that a flat surface of the uneven thickness heat spreader 356 is operatively coupled to either or both of the top cover 364 and bottom cover. The thickness of the uneven thickness heat spreader 356 is, therefore, a dimension of the uneven thickness heat spreader 356 that extends above the interior surface of the bottom cover or below the interior surface of the top cover 364. In an embodiment, the thickness of the first portion 358 may be about 0.1 mm thick. It is appreciated, however, that other thicknesses of the first portion 358 of the uneven thickness heat spreader 356 may be used based on the implementation in a base chassis and an anticipated amount of heat generated by the heat-generating hardware devices and to be transferred within the base chassis 372 of the information handling system 300. In the embodiments described herein, the thermal resistance of the sheet of graphite (or sheet of copper or aluminum) that forms the uneven thickness heat spreader 356 may be equal to the thickness of the sheet of graphite divided by the product of the thermal conductivity of graphite and the length and width (e.g., a chosen cross-sectional area) of the sheet of graphite. Thus, a thicker portion of the uneven thickness heat spreader 356 will reduce thermal resistance at a narrower section or portion.

The uneven thickness heat spreader 356 further includes a second portion 360 (indicated with dashed lines) that has a second thickness that is thicker than the thickness of the first portion 358 of the uneven thickness heat spreader 356 to reduce thermal resistance at the second portion 360. In an embodiment, this second portion 360 is formed along a surface of the uneven thickness heat spreader 356 where a width of the uneven thickness heat spreader 356 is to be reduced due to the placement of the uneven thickness heat spreader 356 at a housing location in the base chassis where the width of the uneven thickness heat spreader 356 must be narrower such as where a mounting boss 376 is formed in the housing of the information handling system 300. A mounting boss 376 may be used to operatively coupled the top cover 364 to the bottom cover or mount other items to the top cover 364 or bottom cover such as a printed circuit board (PCB). The width of the uneven thickness heat spreader 356 may be narrowed to make space for other hardware or to conform to features of the interior of the top cover 364 or bottom cover. However, other portions of the uneven thickness heat spreader 356 remain thin to keep the base chassis thin.

It is appreciated that as the width of the uneven thickness heat spreader 356 is reduced at these housing locations described herein, the thermal resistance of the uneven thickness heat spreader 356 at these housing locations is reduced. In order to overcome this thermal resistance and increase the thermal conductivity across the uneven thickness heat spreader 356 the thickness of the uneven thickness heat spreader 356 is increased at this second portion 360 of the uneven thickness heat spreader 356 where the width of the uneven thickness heat spreader 356 has been reduced. Where the uneven thickness heat spreader 356 is made of graphite, the thickness of the second portion 360 of the uneven thickness heat spreader 356 may be accomplished by compressing more layers of raw graphite at the second portion 360 than at the first portion 358 of the uneven thickness heat spreader 356. In an alternative manufacturing process of the uneven thickness heat spreader 356, additional layers of graphite may be disposed at the second portion 360 via vapor deposition or other processes such as vaporization. Where the uneven thickness heat spreader 356 is made of copper or aluminum, the thicker second portion 360 may be created by molding the uneven thickness heat spreader 356 with the second portion 360 including more material at the second portion 3601.

In an embodiment, as the width of the uneven thickness heat spreader 356 can transition from a short width and thicker second portion 360 to a wider third portion 362, the thickness of the uneven thickness heat spreader 356 may be reduced. This allows the heat spreader to maintain a low profile at the third portion 362 so the base chassis may remain thin or accommodate other structures or an air gap to vent air. This is because the thermal conductivity is maintained as the width of the uneven thickness heat spreader 356 at the third portion 362 is increased while the thickness of the uneven thickness heat spreader 356 at the third portion 362 is decreased. In one embodiment, the thickness of the third portion 362 may be about equal to the thickness of the first portion 358. In an embodiment, the thickness of the third portion 362 may be thinner than the thickness of the second portion 360.

As described herein, the uneven thickness heat spreader 356 may be operatively coupled to a heat-generating device at a first end of the uneven thickness heat spreader 356 so that heat may be conducted into the uneven thickness heat spreader 356 and along the entire length of the uneven thickness heat spreader 356 that includes the first portion 358, second portion 360, and third portion 362 to transfer heat from a warmer section of a base chassis to a cooler section as described herein. In an embodiment, the uneven thickness heat spreader 356 may be operatively coupled to one or more passive cooling devices such as a heat pipe, a vapor chamber, and a fin-stack, among others. These passive cooling devices may conduct heat from heat-generating hardware devices into the first end of the uneven thickness heat spreader 356, along the length of the uneven thickness heat spreader 356 (e.g., through the first portion 358, second portion 360, and third portion 362) and to a second end of the uneven thickness heat spreader 356 for dissipation of heat via convection into the air within the housing of the information handling system 300 such as with a coupled fin-stack. In an embodiment, the heat dissipated into the air by the convective properties of the uneven thickness heat spreader 356 or with a fin-stack may be passed out of the housing of the information handling system 300 by an active cooling device producing an airflow over the uneven thickness heat spreader 356 and/or fin-stack that cools the uneven thickness heat spreader 356 and/or fin-stack and passes the heat out of the housing.

In an embodiment, a first end of the uneven thickness heat spreader 356 may be operatively coupled to a heat-generating hardware device within the housing of the information handling system 300 while the uneven thickness heat spreader 356 is operatively coupled to a battery (not shown) at a second end of the information handling system 300. The battery (not shown) may be formed to be able to conduct an amount of heat with the uneven thickness heat spreader 356 and dissipate that heat over the relatively larger surface area of the battery 322. In one embodiment, the first end of the uneven thickness heat spreader 356 may be at the first portion 358 and the second end may be at the third portion 362 or visa-versa in various embodiments. In another embodiment, the uneven thickness heat spreader 356 may transition from a first thickness at a first portion 358 of the uneven thickness heat spreader 356 to a second thickness at a second portion 360 of the uneven thickness heat spreader 356, and to the third portion 362 where the second portion 358 is thicker than the first portion 358 and third portion 362. In this embodiment, the width of the second portion 360 may be smaller than the width of the first portion 358 and third portion 362 such that heat is still conducted from the first portion 358 to the second portion 360 and into the third portion 362 to be dissipated into the battery 322 operatively coupled to the second end of the uneven thickness heat spreader at the third portion 362. In an embodiment, the uneven thickness heat spreader 356 may be thermally coupled to the battery as described herein while also being placed next to a heat exhaust vent for heat from the uneven thickness heat spreader 356 to be passed out of the housing of the information handling system 300 via operation of an active cooling system described herein.

Figure 4:
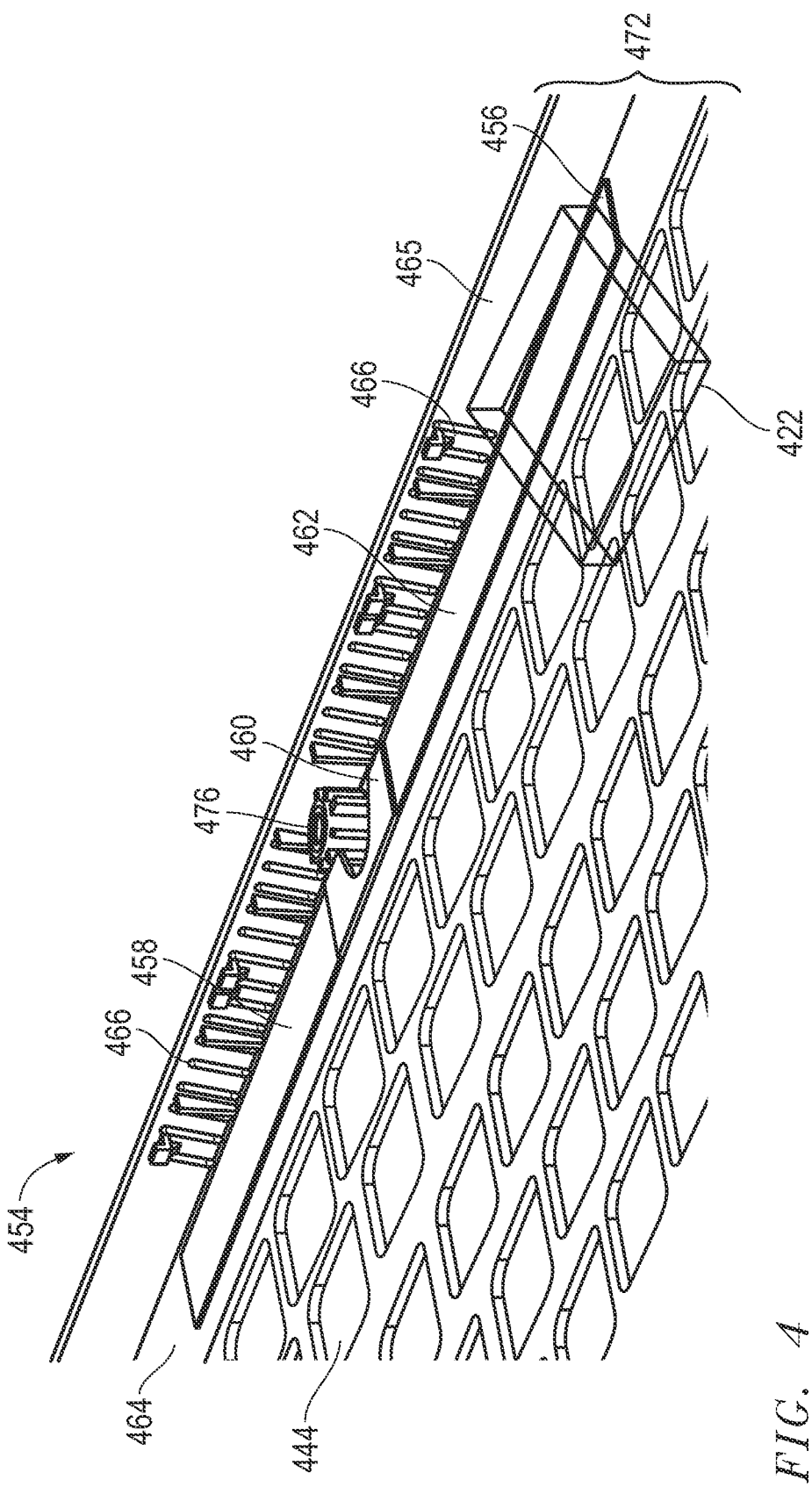
FIG. 4 is a graphic diagram perspective, partial view of an uneven heat spreader cooling system including an uneven heat spreader formed within a base chassis of an information handling system in another embodiment of the present disclosure.

FIG. 4 is a graphic diagram perspective, partial view of an uneven thickness heat spreader cooling system 454 including an uneven thickness heat spreader 456 formed within a base chassis 472 of an information handling system in another embodiment of the present disclosure. FIG. 4 shows the base chassis 472 that includes the top cover 464 with the bottom cover (not shown) removed to show hardware devices within the top cover 464 including the uneven thickness heat spreader 456 of the uneven thickness heat spreader cooling system 454 as described herein. FIG. 4 shows a location of the keyboard 444 in the top cover 464 where the user may provide input to the information handling system 400.

The uneven thickness heat spreader cooling system 454 includes the uneven thickness heat spreader 456. The uneven thickness heat spreader 456 may be a sheet of metal such as copper or aluminum in an embodiment. In another embodiment, the uneven thickness heat spreader 456 may be a sheet of graphite as described in embodiments herein. The present specification describes the uneven thickness heat spreader 456 as being made of a sheet of graphite, however, the present specification contemplates that any other type of heat conductive material such as copper and aluminum, may also be used.

The uneven thickness heat spreader 456 acts as a passive cooling device that conducts heat away from a heat-generating hardware device or other passive cooling systems (e.g., heat pipe, vapor chamber, fin-stack, etc.). In an embodiment, the uneven thickness heat spreader 456 may dissipate heat, via convection heating, into the air within the housing of the information handling system. This heated air may be passed out of the housing of the information handling via use of active cooling systems such as a blower, fan, or ionic blower device that creates an airflow into the base chassis 472 via an air intake vent and out of the housing of the information handling system 400 via one or more heat exhaust vents 466. The exhaust vents 466 may be disposed along a length of a back or side wall 465 of the information handling system base chassis 472. In an embodiment, the uneven thickness heat spreader 456 may be placed near to the heat exhaust vent 466 formed in a back or side wall 465 of the base chassis 472 so that airflow created by active cooling systems may pass air over the uneven thickness heat spreader 456 and any fin-stack located thereon and dissipate heat via convection out of the base chassis 472. In an embodiment, the uneven thickness heat spreader 456 may be operatively coupled to a battery 422 at third portion 462 so that heat can be transferred to and conducted into the body of the battery 422 from the heat-generating devices or other passive cooling device thermally coupled to the first portion 458.

The uneven thickness heat spreader 456 includes a first portion 458 that has a first thickness of material. The sheet of material such as graphite may have a width and length such that a flat surface of the uneven thickness heat spreader 456 is operatively coupled to either or both of the top cover 464 and bottom cover (not shown). The thickness of the uneven thickness heat spreader 456 is, therefore, a dimension of the uneven thickness heat spreader 456 that extends above the interior surface of the bottom cover or below the interior surface of the top cover 464. In an embodiment, the thickness of the first portion 458 may be about 0.1 mm thick. It is appreciated, however, that other thicknesses of the first portion 458 of the uneven thickness heat spreader 456 may be used based on placement in the base chassis and an anticipated amount of heat generated by the heat-generating hardware devices within the base chassis 472 to be transferred by the uneven thickness heat spreader of the information handling system. In the embodiments described herein, the thermal resistance of the sheet of graphite (or sheet of copper or aluminum) that forms the uneven thickness heat spreader 456 may be equal to the thickness of the sheet of graphite divided by the product of the thermal conductivity of graphite and the length and width (e.g., a chosen area) of the sheet of graphite. Thickening a portion 460 of the uneven thickness heat spreader 456 will reduce this thermal resistance at the second portion 460 without thickening the entire uneven thickness heat spreader 456.

Thus, the uneven thickness heat spreader 456 includes the second portion 460 that has a second thickness that is thicker than the thickness of the first portion 458 of the uneven thickness heat spreader 456. In an embodiment, this second portion 460 is formed along a surface of the uneven thickness heat spreader 456 where a width of the uneven thickness heat spreader 456 is to be reduced due to the placement of the uneven thickness heat spreader 456 at a housing location in base chassis 472 where the width of the uneven thickness heat spreader 456 must be narrower such as where a mounting boss 476 is formed in the housing of the information handling system 400. A mounting boss 476 may be used to operatively coupled the top cover 464 to the bottom cover 466 or mount other items to the top cover 464 or bottom cover such as a printed circuit board (PCB). The width of the uneven thickness heat spreader 456 may be narrowed to make space for other hardware or to conform to features of the interior of the top cover 464 or bottom cover of the base chassis 472.

It is appreciated that as the width of the uneven thickness heat spreader 456 is reduced at these housing locations of the base chassis 472 described herein, the thermal resistance of the uneven thickness heat spreader 456 at these housing locations is increased. In order to overcome this thermal resistance increase, and to increase the thermal conductivity across the uneven thickness heat spreader 456 the thickness of the uneven thickness heat spreader 456 is increased at this second portion 460 of the uneven thickness heat spreader 456 where the width of the uneven thickness heat spreader 456 has been reduced but overall thicknesses of the uneven thickness heat spreader 456 does not need to be thickened. Thus, use of space in and thickness required for the base chassis 472 may also be limited. Where the uneven thickness heat spreader 456 is made of graphite, the thickness of the second portion 460 of the uneven thickness heat spreader 456 may be accomplished by compressing more amounts of raw graphite at the second portion 460 than at the first portion 458 of the uneven thickness heat spreader 456. In an alternative manufacturing process of the uneven thickness heat spreader 456, additional layers of graphite may be disposed at the second portion 460 via vapor deposition or other processes such as vaporization. Where the uneven thickness heat spreader 456 is made of copper or aluminum, the thicker second portion 460 may be created by molding the uneven thickness heat spreader 456 with the second portion 460 including more material.

In an embodiment, as the width of the uneven thickness heat spreader 456 can transition from a narrower width and thicker second portion 460 to a wider third portion 462, the thickness of the uneven thickness heat spreader 456 may be reduced again. This is because the thermal conductivity is maintained as the width of the uneven thickness heat spreader 456 at the third portion 462 is increased while the thickness of the uneven thickness heat spreader 456 at the third portion 462 may be decreased. In one embodiment, the thickness of the third portion 462 may be about equal to the thickness of the first portion 458. In an embodiment, the thickness of the third portion 462 may be thinner than the thickness of the second portion 460.

As described herein, the uneven thickness heat spreader 456 may be operatively coupled to a heat-generating device or passive cooling structure at a first end of the uneven thickness heat spreader 456 so that heat may be conducted into the uneven thickness heat spreader 456 and transferred along the entire length of the uneven thickness heat spreader 456 that includes the first portion 458, second portion 460, and third portion 462 to cooler area of the base chassis 472 as described herein. In an embodiment, the uneven thickness heat spreader 456 may be operatively coupled to one or more passive cooling devices such as a heat pipe, a vapor chamber, and a fin-stack, among others. These passive cooling devices may conduct heat from heat-generating hardware devices into the first end of the uneven thickness heat spreader 456, along the length of the uneven thickness heat spreader 456 (e.g., through the first portion 458, second portion 460, and third portion 462) and to a second end of the uneven thickness heat spreader 456 for dissipation of heat and convective heating of the air within the housing of the information handling system 400 along exhaust vents 466. In an embodiment, the heat dissipated into the air by the convective properties of the uneven thickness heat spreader 456 may be passed out of the housing of the information handling system 400 by an active cooling device producing an airflow over the uneven thickness heat spreader 456 that cools the uneven thickness heat spreader 456 and passes the heat out of the housing via exhaust vents 466 along back or side wall 465.

In an embodiment, a first end of the uneven thickness heat spreader 456 may be operatively coupled to a heat-generating hardware device within the housing of the information handling system 400 while the uneven thickness heat spreader 456 is operatively coupled to a battery 422 at a second end of the information handling system 400. The battery 422 may have a high heat capacity to be able to conduct and absorb an amount of heat with the uneven thickness heat spreader 456 and dissipate that heat over the relatively larger surface area of the battery 422. In an embodiment, the heat spreader 456 may be thermally coupled to the battery 422 at a third portion 462 as described herein while also being placed next to a heat exhaust vent 466 for heat from the heat spreader 456 to be passed out of the housing of the information handling system via operation of an active cooling system described herein. In one embodiment, the first end of the uneven thickness heat spreader 456 may be at the first portion 458 and the second end may be at the third portion 462 or visa-versa in various embodiments. In another embodiment, the uneven thickness heat spreader 456 may transition from a first thickness at a first portion 458 of the uneven thickness heat spreader 456 to a second thickness at a second portion 460 of the uneven thickness heat spreader 456, and to the third portion 462 where the second portion 458 is thicker than the first portion 458 and third portion 462. In this embodiment, the width of the second portion 460 may be smaller than the width of the first portion 458 and third portion 462 such that heat is still conducted from the first portion 458 to the second portion 460 and into the third portion 462 to be dissipated into the battery 422 operatively coupled to the second end of the uneven thickness heat spreader at the third portion 462. In an embodiment, the uneven thickness heat spreader 456 may be thermally coupled to the battery as described herein while also being placed next to a heat exhaust vent for heat from the uneven thickness heat spreader 456 to be passed out of the housing of the information handling system 400 via operation of an active cooling system described herein.

Figure 5:
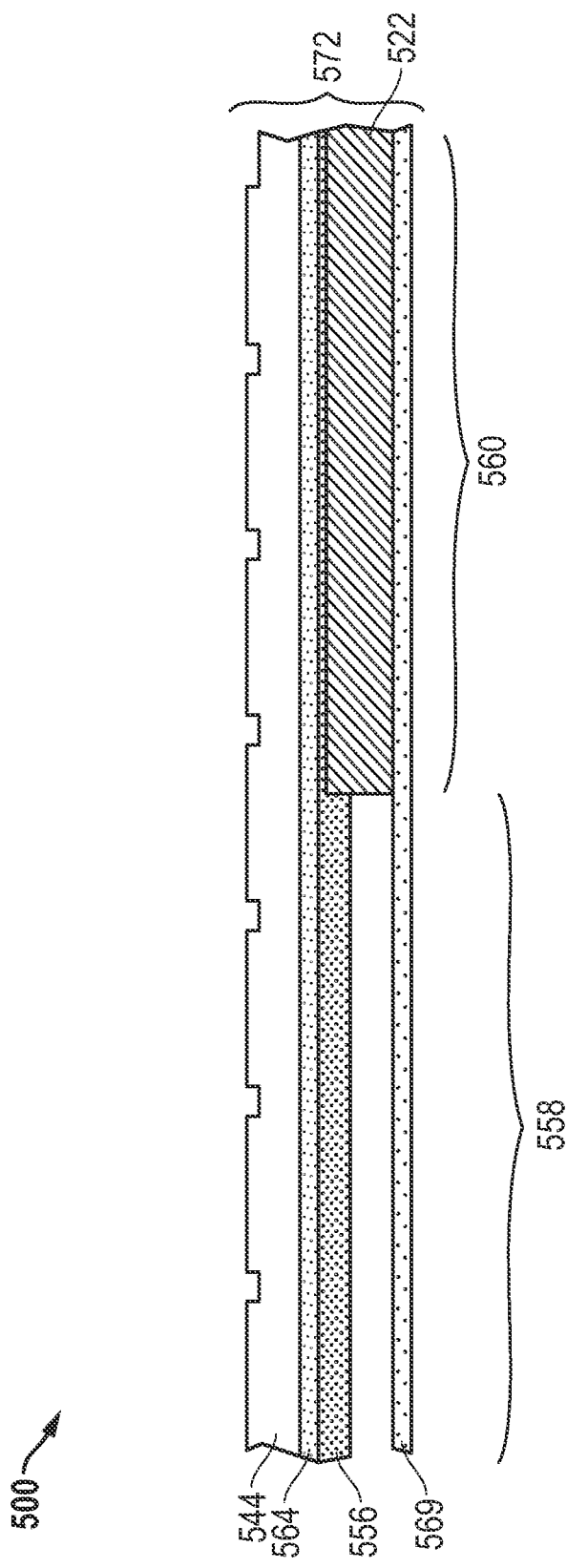
FIG. 5 is a block diagram side view of an uneven heat spreader cooling system including an uneven heat spreader at a battery formed within a base chassis of an information handling system in an embodiment of the present disclosure.

FIG. 5 is a block diagram side, cut-out view of an uneven heat spreader cooling system 500 including an uneven thickness heat spreader 556 at a battery 522 formed within a base chassis 572 of an information handling system in an embodiment of the present disclosure. FIG. 5 shows a partial side, cut-out view of both the uneven thickness heat spreader 556 and the battery 522 and it is appreciated that both the battery 522 and uneven thickness heat spreader 556 may extend further within the base chassis 572 of the information handling system 500. In an embodiment, the base chassis 572 of the information handling system includes a top cover 564 that houses a keyboard 544 or other input device such as a trackpad (not shown). The top cover 564 may be operatively coupled to the base chassis 572 (e.g., via a mounting boss) to house the battery 522 and the uneven thickness heat spreader 556 among other hardware components to be housed within the base chassis 572.

As described herein, in an embodiment, a first end of the uneven thickness heat spreader 556 may be operatively coupled to a heat-generating hardware device within the base chassis 572 of the information handling system 500. These heat-generating devices may include a hardware processing device (e.g., a hardware processor, an EC, a GPU, a CPU, etc.) as well as other hardware devices that create heat during operation.

In an embodiment, a second end of the uneven thickness heat spreader 556 is operatively coupled to the battery 522 of the information handling system 500. The battery 522 may be formed to be able to conduct an amount of heat from the uneven thickness heat spreader 556 and absorb and dissipate that heat over the relatively larger surface area of the battery 522. However, the battery 522 may need to be thick to maximize power storage capacity while fitting in the narrow-profile base chassis 372. Thus, use of a thin portion 560 of the uneven thickness heat spreader 556 may be necessary at battery 522. In this embodiment, the uneven thickness heat spreader 556 may transition from a first thickness at the first portion 558 of the uneven thickness heat spreader 556 to a second thickness at a second portion 560 of the uneven thickness heat spreader 556. FIG. 5 shows that the first portion 558 is thicker than the second portion 560. In this embodiment, the width of the first portion 558 may be smaller than the width of the second portion 560 such that heat is still conducted from the first portion 558 to the second portion 560 to be transferred to and dissipated into the battery 522. In an embodiment, the uneven thickness heat spreader 556 may be thermally coupled to the battery 522 as described herein while also being placed next to a heat exhaust vent (not shown) for heat from the uneven thickness heat spreader 556 to be passed out of the housing of the information handling system 500 via operation of an active cooling system described herein.

It is appreciated that the width of the second portion 560 of the uneven thickness heat spreader 556 may be significantly increased relative to the first portion 558 so that heat may be sufficiently conducted over a large surface of and into the battery 522 which has a high heat capacity. The amount of heat conducted into the first portion 558 and then into the second portion 560 may depend on the thermal conductivity of the material used to form the uneven thickness heat spreader 556. The present specification describes the uneven thickness heat spreader 556 as being made of a sheet of graphite, however, the present specification contemplates that any other type of heat conductive material such as copper and aluminum, may also be used. In the embodiments described herein, the thermal resistance of the sheet of graphite (or sheet of copper or aluminum) that forms the uneven thickness heat spreader 556 may be equal to the thickness of the sheet of graphite divided by the product of the thermal conductivity of graphite and the length and width (e.g., a chosen cross-section area of heat transfer) of the sheet of graphite.

Figure 6:
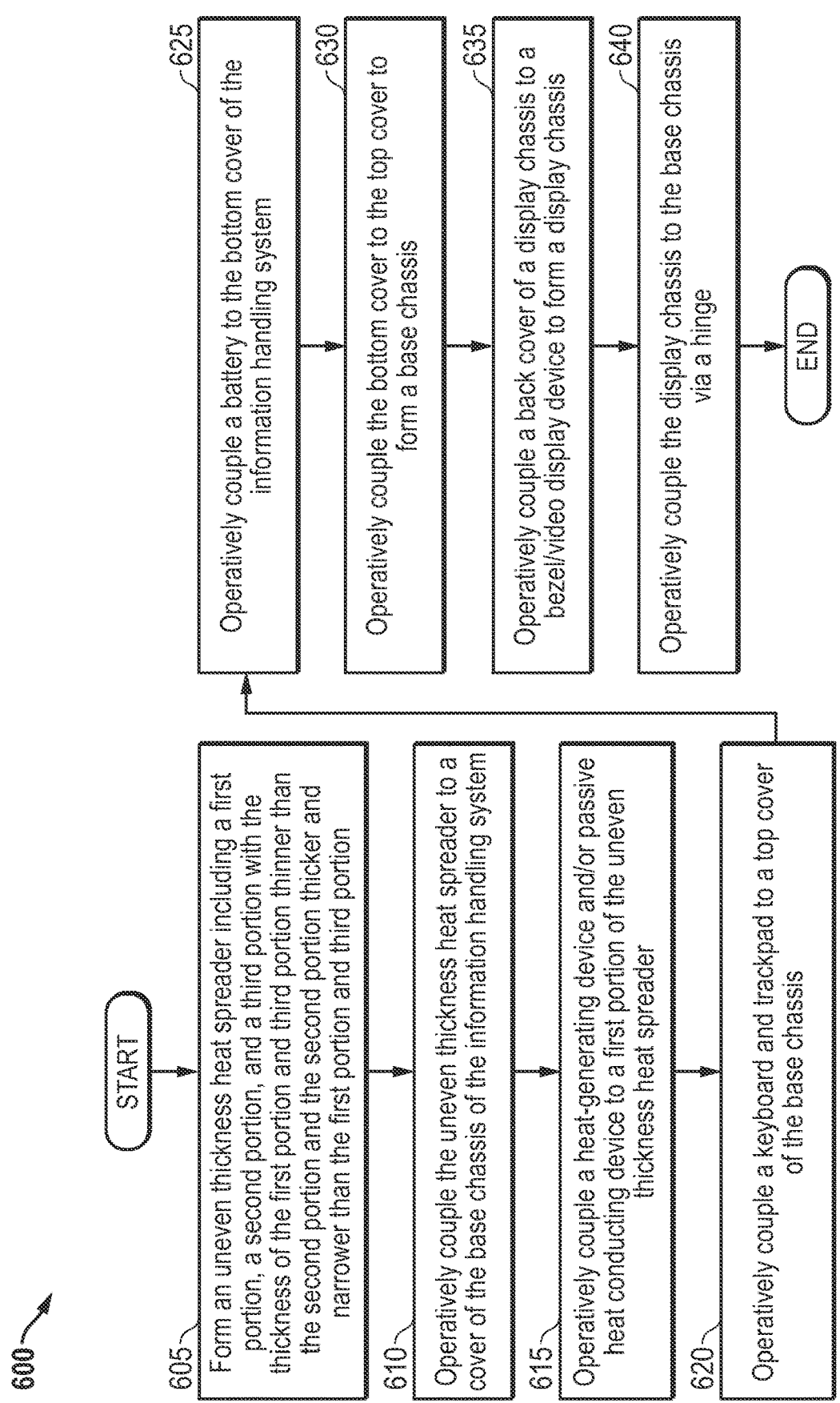
FIG. 6 is a flow diagram of a method of manufacturing an information handling system including an uneven heat spreader cooling system according to an embodiment of the present disclosure.

FIG. 6 is a flow diagram of a method 600 of manufacturing an information handling system including an uneven heat spreader cooling system according to an embodiment of the present disclosure. The method 600 includes, at block 605 with forming an uneven thickness heat spreader including a first portion and a second portion with the thickness of the first portion thinner than the second portion. As described herein, the uneven thickness heat spreader may be of a sheet of graphite, copper, aluminum, or other heat conducting materials. In an embodiment, the method of forming the uneven thickness heat spreader may be different based on the different materials used to form the uneven thickness heat spreader. In the embodiment where the uneven thickness heat spreader is made of graphite, the relative thicker second portion of the uneven thickness heat spreader may be formed by compressing more amounts of raw graphite at the second portion than at other portions of the uneven thickness heat spreader such as the first portion. In an alternative manufacturing process of the uneven thickness heat spreader that is made of graphite, additional layers of graphite may be disposed at the second portion via vapor deposition or other processes such as vaporization.

Where the uneven thickness heat spreader is made of copper or aluminum, the thicker second portion may be created by molding the uneven thickness heat spreader with the second portion including more material. In an embodiment, the copper or aluminum may be pressed into a mold that in defines boundaries for the first portion, second portion, or other portions of the uneven thickness heat spreader such that an amount of material pressed into the mold may differ from the first portion, the second portion, a third portion, or any other portion.

In an embodiment, as the width of the uneven thickness heat spreader can transition from a narrow width and thicker second portion to a wider third portion, the thickness of the uneven thickness heat spreader may be reduced. This is because the thermal conductivity is maintained as the width of the uneven thickness heat spreader at the third portion is increased while the thickness of the uneven thickness heat spreader at the third portion is decreased. In one embodiment, the thickness of the third portion may be about equal to the thickness of the first portion. In an embodiment, the thickness of the third portion may be thinner than the thickness of the second portion.

In an embodiment, this second portion of the uneven thickness heat spreader is formed along a surface of the uneven thickness heat spreader where a width of the uneven thickness heat spreader is to be reduced due to the placement of the uneven thickness heat spreader at a housing location of an information handling system chassis where the width of the uneven thickness heat spreader must be shorter, such as where a mounting boss is formed in the housing of the information handling system. A mounting boss may be used to operatively coupled the top cover to the bottom cover or mount other items to the top cover or bottom cover such as a printed circuit board (PCB). The width of the uneven thickness heat spreader may be narrowed to make space for other hardware or to conform to features of the interior of the top cover or bottom cover.

The method 600 may include, at block 610, with operatively coupling the uneven thickness heat spreader to a cover of the base chassis of the information handling system. As described herein, the placement of the uneven thickness heat spreader within the base chassis may depend on a number of factors including the placement of the heat-generating devices within the base chassis, the placement of, for example, a battery, the placement of a heat exhaust vent, among other factors. In an embodiment described in FIGS. 3 and 4, the uneven thickness heat spreader is placed at or near or along a heat exhaust vent or vents. In an embodiment described in FIG. 5 the uneven thickness heat spreader may additionally or alternatively be placed at or near a location where a battery is to be placed within the housing of the base chassis.

The method 600 further includes, at block 615, operatively coupling a heat-generating device and/or passive heat conducting device to a first end of the uneven thickness heat spreader. In an embodiment, the uneven thickness heat spreader conducts heat from and away from these heat-generating devices to a cooler area of an information handling system chassis so that the temperature of the heat-generating devices are cooled by the thermal conductivity properties of the uneven thickness heat spreader. Additionally, or alternatively, the first end of the uneven thickness heat spreader is operatively coupled to other passive heat conducting devices such as a vapor chamber, a heat pipe, and/or a fin-stack. In an embodiment, a second end, opposite the first end of the uneven thickness heat spreader, the uneven thickness heat spreader may be coupled to the battery so that heat conducted through the uneven thickness heat spreader may be conducted into the battery which may have a high heat capacity and work as a heat dump or reservoir.

The method 600 further includes, at block 620, operatively coupling a keyboard and trackpad to a top cover of the base chassis. As described herein, the top cover houses the keyboard, touchpad/trackpad, and any cover in which these components are set. The keyboard and trackpad may be used by a user to provide input to the information handling system. The top cover, in an embodiment, may secure the keyboard 544 to an interior or exterior side of the top cover.

The method 600 further includes operatively coupling a battery to a bottom cover of the information handling system at block 625. The battery, in an embodiment, may be placed within the bottom cover at a location where the second end of the uneven thickness heat spreader, having a thinner thickness than other portions, is located so that the heat may be conducted to the battery as described herein. In another embodiment, the placement of the battery may not be at or near the second end of the uneven thickness heat spreader in those embodiments where the battery is not used as a heat dump or reservoir from the uneven thickness heat spreader.

The method 600 also includes operatively coupling the bottom cover to the top cover to form the base chassis. As described herein, the second portion of the uneven thickness heat spreader is reduced in width where, in some example embodiments, the housing of the information handling system (e.g., top cover or bottom cover) include features such as mounting bosses. A mounting boss, therefor, may be used to operatively coupled the top cover to the bottom cover or mount other items to the top cover or bottom cover such as a printed circuit board (PCB). In the example where the mounting boss is used to couple the top cover to the bottom cover, the top cover may be operatively coupled to the bottom cover via this mounting boss.

The method 600 further includes, at block 635, with operatively coupling a back cover of the display chassis to a bezel and/or video display device to form a display chassis. The display chassis may house other hardware devices of the information handling system such as a web-cam, the video display device, and other hardware devices and the method 600 may further include, at block 635, with incorporating these other hardware devices into the display chassis.

At block 640, the method 600 further includes operatively coupling the display chassis to the base chassis via a hinge. In embodiments described herein, the information handling system is described as a laptop-type information handling system that includes a base chassis operatively coupled to a display chassis via a hinge. In the example shown in FIG. 2 for example, the information handling system may be a 360° information handling system where an exterior surface of the bottom cover of a base chassis may be brought towards an exterior side of a back cover of the display chassis to place the information handling system in a tablet configuration in one embodiment. In an embodiment, the information handling system may also be placed in a laptop configuration where the base chassis is lying flat on a surface with the display chassis being placed upright from the base chassis. At this point, the method 600 may end.

The blocks of the flow diagrams of FIG. 6 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
   a hardware processor;
   a memory device;
   a power management unit (PMU); and
   an uneven thickness heat spreader cooling system comprising:
      an uneven thickness heat spreader having a first thickness along a first portion of the uneven thickness heat spreader and a second thickness along a second portion of the uneven thickness heat spreader;
   wherein the second thickness along a second portion of the uneven thickness heat spreader is formed at an information handling system chassis location where a width of the uneven thickness heat spreader is narrower than at the first portion of the uneven thickness heat spreader to transfer heat from a warmer portion of the information handling system chassis to a cooling portion of the information handling system chassis.

2. The information handling system of claim 1, wherein the information handling system chassis location is a mounting boss used to couple a bottom chassis cover to a top chassis cover of a base chassis of the information handling system chassis.

3. The information handling system of claim 1 further comprising:
   the uneven thickness heat spreader being made of graphite with the second thickness along a second portion of the uneven thickness heat spreader including more stacked and compressed layers of graphite than the first thickness along a first portion of the uneven thickness heat spreader.

4. The information handling system of claim 1 further comprising:
   the uneven thickness heat spreader being made of copper with the second thickness along a second portion of the uneven thickness heat spreader being molded thicker than the first thickness along a first portion of the uneven thickness heat spreader.

5. The information handling system of claim 1 further comprising:
   a passive heat conducting device operatively coupled to a first end of the uneven thickness heat spreader wherein the second thickness along a second portion of the uneven thickness heat spreader increases the heat conductivity from the first end of the uneven thickness heat spreader to the second end of the uneven thickness heat spreader through the narrower second portion of the uneven thickness heat spreader.

6. The information handling system of claim 1 further comprising:
   the uneven thickness heat spreader formed along a heat exhaust vent at an edge wall of the information handling system chassis.

7. The information handling system of claim 1 further comprising:
   a battery operatively coupled to a second end of the uneven thickness heat spreader at a portion of the uneven thickness heat spreader that is thinner than the second portion wherein the second thickness along the second portion of the uneven thickness heat spreader increases the heat conductivity from the first end of the uneven thickness heat spreader to the second end of the uneven thickness heat spreader and to the operatively coupled battery.

8. An uneven thickness heat spreader cooling system comprising:
   an uneven thickness heat spreader having a first thickness along a first portion of the uneven thickness heat spreader, a second thickness along a second portion of the uneven thickness heat spreader, and a third thickness along a third portion of the uneven thickness heat spreader, wherein the second thickness along a second portion of the uneven thickness heat spreader is formed at an information handling system chassis location within an information handling system chassis where a width of the uneven thickness heat spreader is narrower than at the first portion of the uneven thickness heat spreader and the second thickness is thicker than the first and third thicknesses;
   an information handling system heat-generating component thermally coupled to the first portion of the uneven thickness heat spreader; and
   a battery heat reservoir thermally coupled to the third portion of the uneven thickness heat spreader.

9. The uneven thickness heat spreader cooling system of claim 8 comprising:
   wherein the information handling system chassis location is a mounting boss used to couple a bottom chassis cover to a top chassis cover of the information handling system chassis.

10. The uneven thickness heat spreader cooling system of claim 8 comprising:
the uneven thickness heat spreader being made of graphite with the second thickness along the second portion of the uneven thickness heat spreader including more stacked and compressed layers of graphite than the first thickness along the first portion of the uneven thickness heat spreader.

11. The uneven thickness heat spreader cooling system of claim 8 comprising:
the uneven thickness heat spreader being made of copper with the second thickness along the second portion of the uneven thickness heat spreader being molded thicker than the first thickness along the first portion of the uneven thickness heat spreader.

12. The uneven thickness heat spreader cooling system of claim 8 comprising:
a passive heat conducting device thermally coupled between the information handling system heat-generating component and the first portion of the uneven thickness heat spreader wherein the second thickness along the second portion of the uneven thickness heat spreader increases the heat conductivity from the first portion of the uneven thickness heat spreader to the third portion of the uneven thickness heat spreader.

13. The uneven thickness heat spreader cooling system of claim 8 comprising:
the uneven thickness heat spreader formed at a heat exhaust vent formed along an edge of the information handling system chassis.

14. The uneven thickness heat spreader cooling system of claim 8 comprising:
the battery heat reservoir operatively coupled to the third portion of the uneven thickness heat spreader, wherein third thickness is thinner than the second portion of the uneven thickness heat spreader accommodates a battery dimension in the information handling system chassis.

15. An information handling system comprising:
a hardware processor;
a memory device;
a video display device;
a power management unit (PMU); and
an uneven thickness heat spreader cooling system comprising:
an uneven thickness heat spreader having a first thickness along a first portion of the uneven thickness heat spreader, a second thickness along a second portion of the uneven thickness heat spreader, and third portion of the uneven thickness heat spreader on an opposite end of the second portion of the uneven thickness heat spreader from the first portion having the first thickness;
wherein the second thickness along a second portion of the uneven thickness heat spreader is formed at an information handling system chassis location where a width of the uneven thickness heat spreader is narrower than at the first portion of the uneven thickness heat spreader and the second thickness of the second portion is thicker than the first thickness of the first portion.

16. The information handling system of claim 15, wherein the information handling system chassis location includes a mounting boss used to couple a bottom chassis cover to a top chassis cover of the information handling system chassis.

17. The information handling system of claim 16 further comprising:
the uneven thickness heat spreader being made of graphite with the second thickness along a second portion of the uneven thickness heat spreader including more stacked and compressed layers of graphite than the first thickness along a first portion of the uneven thickness heat spreader.

18. The information handling system of claim 16 further comprising:
a passive heat conducting device operatively coupled to the first portion of the uneven thickness heat spreader wherein the second thickness along the second portion of the uneven thickness heat spreader increases the heat conductivity from the first portion of the uneven thickness heat spreader to the third portion of the uneven thickness heat spreader.

19. The information handling system of claim 16 further comprising:
the uneven thickness heat spreader formed at a heat exhaust vent formed at an edge the information handling system chassis.

20. The information handling system of claim 16 further comprising: the battery operatively coupled to the third portion of the uneven thickness heat spreader wherein a third thickness is thinner than the second thickness of the second portion of the uneven thickness heat spreader to accommodate a battery thickness of the battery in the information handling system chassis.

* * * * *